US007711132B2

(12) United States Patent
Küfner et al.

(10) Patent No.: US 7,711,132 B2
(45) Date of Patent: May 4, 2010

(54) HEARING AID

(75) Inventors: Birgit Küfner, Uttenreuth (DE); Tom Weidner, Erlangen (DE)

(73) Assignee: Siemens Audiologische Technik GmbH, Erlangen (DE)

(*) Notice: Subject to any disclaimer, the term of this patent is extended or adjusted under 35 U.S.C. 154(b) by 1097 days.

(21) Appl. No.: 11/031,800

(22) Filed: Jan. 7, 2005

(65) Prior Publication Data

US 2005/0152567 A1 Jul. 14, 2005

(30) Foreign Application Priority Data

Jan. 9, 2004 (DE) ...................... 10 2004 001 500

(51) Int. Cl.
*H03G 3/20* (2006.01)

(52) U.S. Cl. ........................................ 381/312; 381/57

(58) Field of Classification Search ................. 381/312, 381/317; 340/384.71, 500, 501, 527, 536
See application file for complete search history.

(56) References Cited

U.S. PATENT DOCUMENTS 4,491,980 A * 1/1985 Ichikawa .................... 455/344
4,660,027 A 4/1987 Davis
5,524,150 A 6/1996 Sauer
6,310,556 B1 10/2001 Green et al.
6,320,969 B1 * 11/2001 Killion ........................ 381/323
7,031,481 B2 * 4/2006 Mortensen .................. 381/312
2002/0021814 A1 2/2002 Roeck
2002/0159613 A1 10/2002 Killion

FOREIGN PATENT DOCUMENTS

DE 32 07 412 A1 9/1983
DE 100 40 660 A1 2/2001
EP 0 557 847 B1 9/1993

* cited by examiner

*Primary Examiner*—Walter F Briney, III

(57) ABSTRACT

The object is to ensure that device signals intended, for example, to inform hearing aid wearers about program changes or the end of a battery's life are perceived independently of ambient noise. Provision is therefore made, for instance, for reducing the level of the input signal with the aid of a gain adjuster (12) so that a device signal from a generator (4) driven via a control element (6) such as, for example, a program-changing switch, and via a control logic (5) can be perceived. Other possible solutions are to change the level of the device signal as a function of the level of the input signal or to mute the input signal while the device signal is fed out.

20 Claims, 5 Drawing Sheets

HEARING AID

CROSS REFERENCE TO RELATED APPLICATIONS

This application claims priority to the German application No. 10 2004 001 500.7, filed Jan. 9, 2004 which is incorporated by reference herein in its entirety.

FIELD OF INVENTION

The present invention relates to a hearing aid having a reception device for receiving an input signal, a registering device for registering a hearing aid value, a signal generating device for generating a device signal as a function of said hearing aid value, and an output device for feeding out an output signal based on the input signal and device signal. The present invention further relates to a corresponding method for operating a hearing aid.

BACKGROUND OF INVENTION

Signal outputs for program changes, volume adjustments, end of battery life etc. are customary in present-day hearing systems or, as the case may be, hearing aids according to the publication EP 0 557 847 A1. The signal that is fed out is what is termed a device signal, which is to say a signal generated by the hearing aid itself. A device signal is typically generated in the form of a whistling tone. It is generally possible to set at least the frequency and level of said device signal.

SUMMARY OF INVENTION

It is nevertheless the case that loud ambient noise will prevent the perception of device signals that are very important for the hearing aid wearer. As an instance of this, device signals are obscured by street noise. This problem can be combated by raising the level of the device signal. This will at least reduce the frequency of occurrence with which the device signals are obscured by loud ambient noise. A disadvantage of raising the level is that, especially in a very quiet environment, the device signals will then be experienced as being highly irritating and disagreeable.

A combined hearing aid and audiotone-playing system is known from the publication DE 100 40 660 A1. Externally generated audiotone signals and artificially generated information or warning signals can here be received by a receiving unit belonging to the hearing aid. The received signals can be merged in within the hearing aid, compressed, and mixed in a mutually adjustable manner in terms of frequency response and volume.

An object of the present invention is thus to optimize the perceptibility of device signals in hearing aids.

Said object is achieved by the claims.

A method is furthermore provided for operating a hearing aid.

The principal advantage of the present invention is that prevailing ambient noise is taken into consideration during automatic or, as the case may be, adaptive matching of the device signal. The same advantage comes into effect in the converse case of matching the hearing aid input signal to the device signal. Obscuring can also be successfully prevented advantageously by mutually matching the two signals. As a result, the device signals will, on the one hand, always be perceptible and, on the other hand, will never be experienced as being disagreeable or too loud. Automatic matching of this type will furthermore help enhance the operating convenience and satisfaction of the hearing aid wearer.

The hearing aid value preferably represents a setting value, a status value, and change-of-setting information or change-of-status information. A device signal will be generated thereby in the hearing aid if for example, a certain hearing program has newly launched or the charge level of the hearing aid's battery has become low.

The specific type of device signal can be generated as a function of the hearing aid value. As an instance of this, the frequency of occurrence, the volume, or the melody of a battery status signal can be changed automatically with the charge status of the battery. The duration and level of the device signal and/or its type can furthermore also be matched to the input signal. In this way it is possible for example for the input signal to be muted for a comparatively long period of time before the device signal is fed out when an input signal is loud, while when an input signal is quiet it can be muted a shorter period of time before the device signal is fed out. This will allow obscuring effects to be for the most part prevented.

The level of the input signal can alternatively or additionally also be matched to the device signal. Obscuring effects can likewise also be prevented or reduced in this way. A specific form of this would be total suppression of the input signal when the device signal is fed out. It is possible in this way to ensure that the device signal will be perceived.

In a highly preferred variant the device signal is temporally matched to the input signal. The device signal could in particular only be fed out when the input signal is below a predefined level. This will prove particularly advantageous in the case of status information which is not very time-critical such as, for example, that relating to the battery status.

It can in general be ensured that matching of the device signal to the input signal or of the input signal to the device signal will take place as a function of the level and type of the input signal and/or a classification thereof. A simple decision criterion can thus be provided for said matching.

Specific advantages will also ensue from a combination of the above-cited variants, which is to say from reciprocal automatic mutual matching of the input signals and device signals.

BRIEF DESCRIPTION OF THE DRAWINGS

The present invention will be explained in more detail below with reference to the attached drawings, in which.

DETAILED DESCRIPTION OF INVENTION

The exemplary embodiments described in more detail below are preferred embodiments of the present invention.

Figure 1:
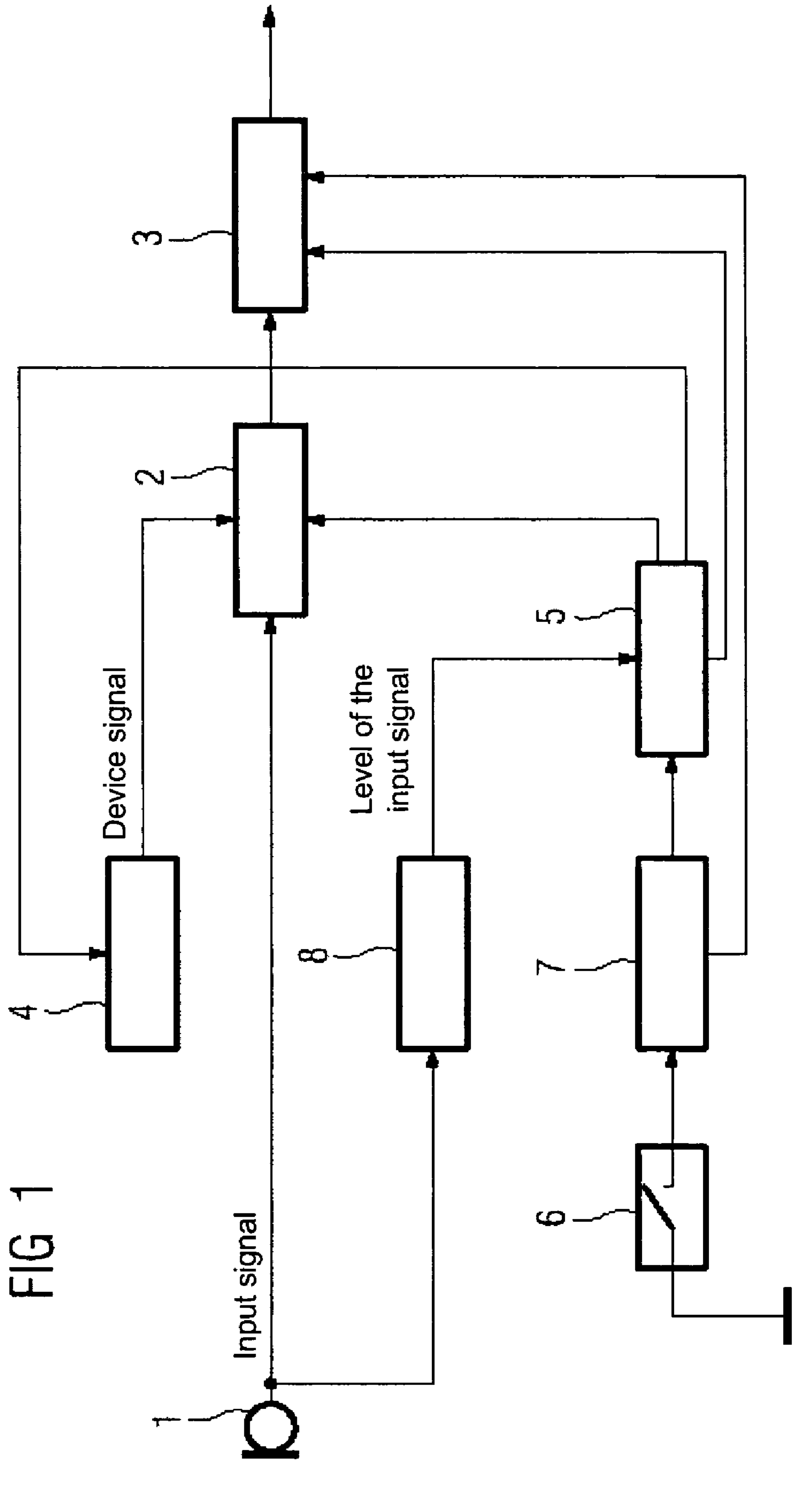
FIG. 1 is a block diagram of a hearing aid with muting of the input signal.

The block diagram in FIG. 1 shows a hearing aid according to a first embodiment with which an input signal can be muted so that a device signal can be perceived by the hearing aid wearer. The input signal of a microphone 1 is to this end routed to a changeover switch 2 before being routed to a further hearing aid signal processing device 3. A device signal is generated with the aid of a generator 4. Said generator is driven by means of a control logic 5 for generating a signal. The control logic 5 simultaneously drives the changeover switch 2 so that the device signal from the generator 4 can be sent instead of the input signal to the further hearing aid signal processing device 3.

The control signal in the control logic 5 can be triggered manually via a control element 6. An operating interface 7 connected between them generates a corresponding drive signal for the control logic 5. Said control element can be, for example, a program-changing switch, a remote control, or a volume adjustment wheel. A drive signal is consequently also sent to the hearing aid signal processing device 3 from the operating interface 7. Said drive signal can be used, inter alia, to “freeze” compression, background noise suppression, and other adaptive algorithms associated with signal processing while device signals are being fed out and to resume signal processing applying the same setting values when the device signals have been fed out.

Toward that end, the control logic 5 has a timer for specifying the duration of the deactivation of the input signal as well as the duration of the device signal. A control signal is sent by the control logic 5 to the generator 4 and to the changeover switch 2. When a device signal is triggered, muting of the input signal can thus be achieved that is of longer duration than that of the device signal so that masking effects can for the most part be precluded. Muting takes place prior to and during output of the device signal.

Figure 2:
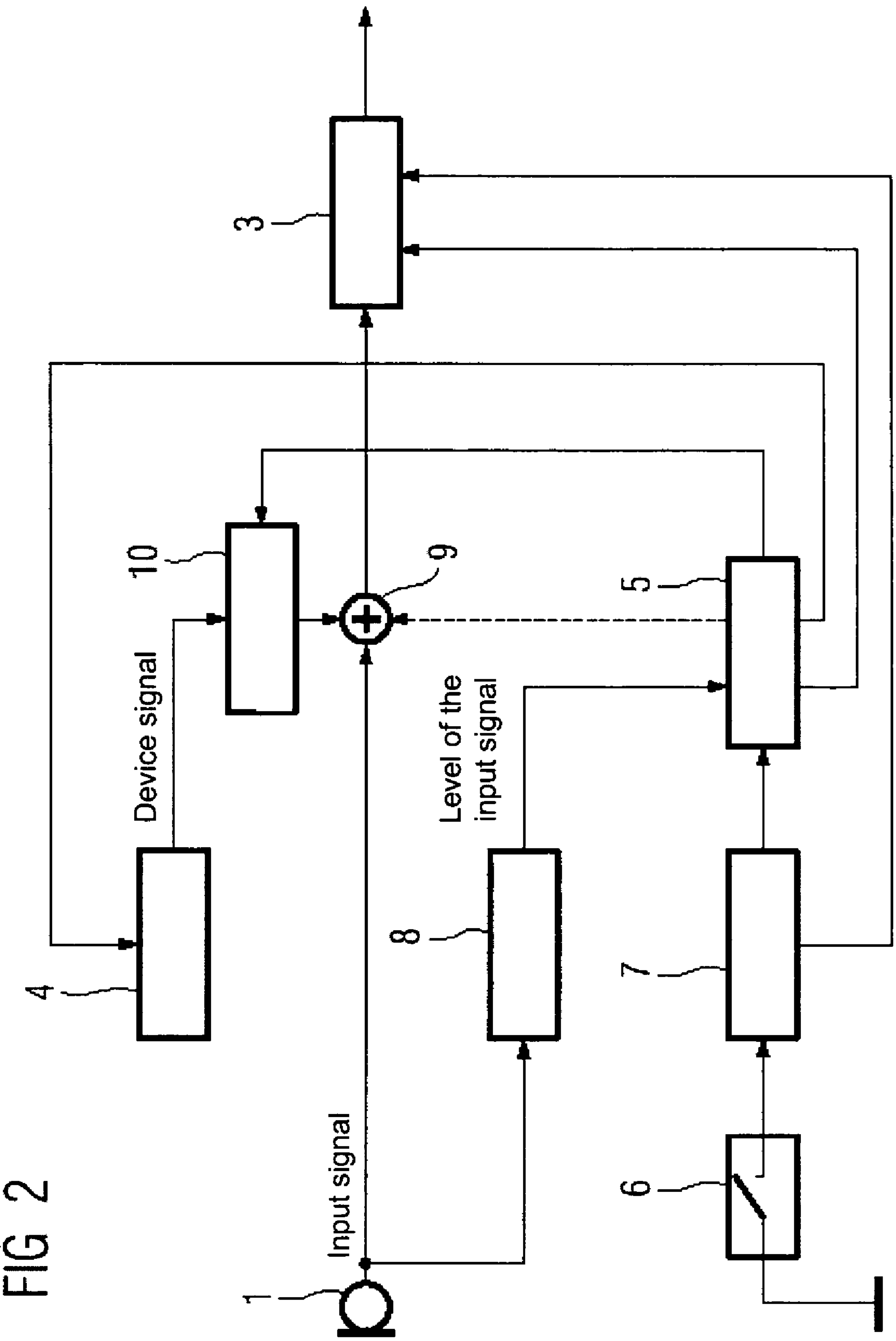
FIG. 2 is a block diagram relating to raising the level of the device signal.

According to a second embodiment of the present invention, shown in FIG. 2, the level of the device signal is set automatically such that it exceeds that of the current input signal at least by a certain extent. The changeover switch 2 shown in FIG. 1 is to this end replaced by an adder 9. So that the level of the device signal can be varied by the generator 4, a gain adjuster 10 is connected between said generator and the adder 9. The level of the device signal can thus be regulated via the control logic 5 using the level of the input signal. A control line (dashed arrow in FIG. 2) is additionally provided from the control logic 5 to the adder 9 in order to activate or deactivate the addition of the two signals. It is thereby possible, for example, to deactivate the device signal generator while the hearing aid is in normal operation or not to acoustically indicate a program change by means of a device signal if the hearing aid wearer so wishes. On the other hand, the input signal could also be muted with the controlled adder as in the case of the first embodiment.

Figure 3:
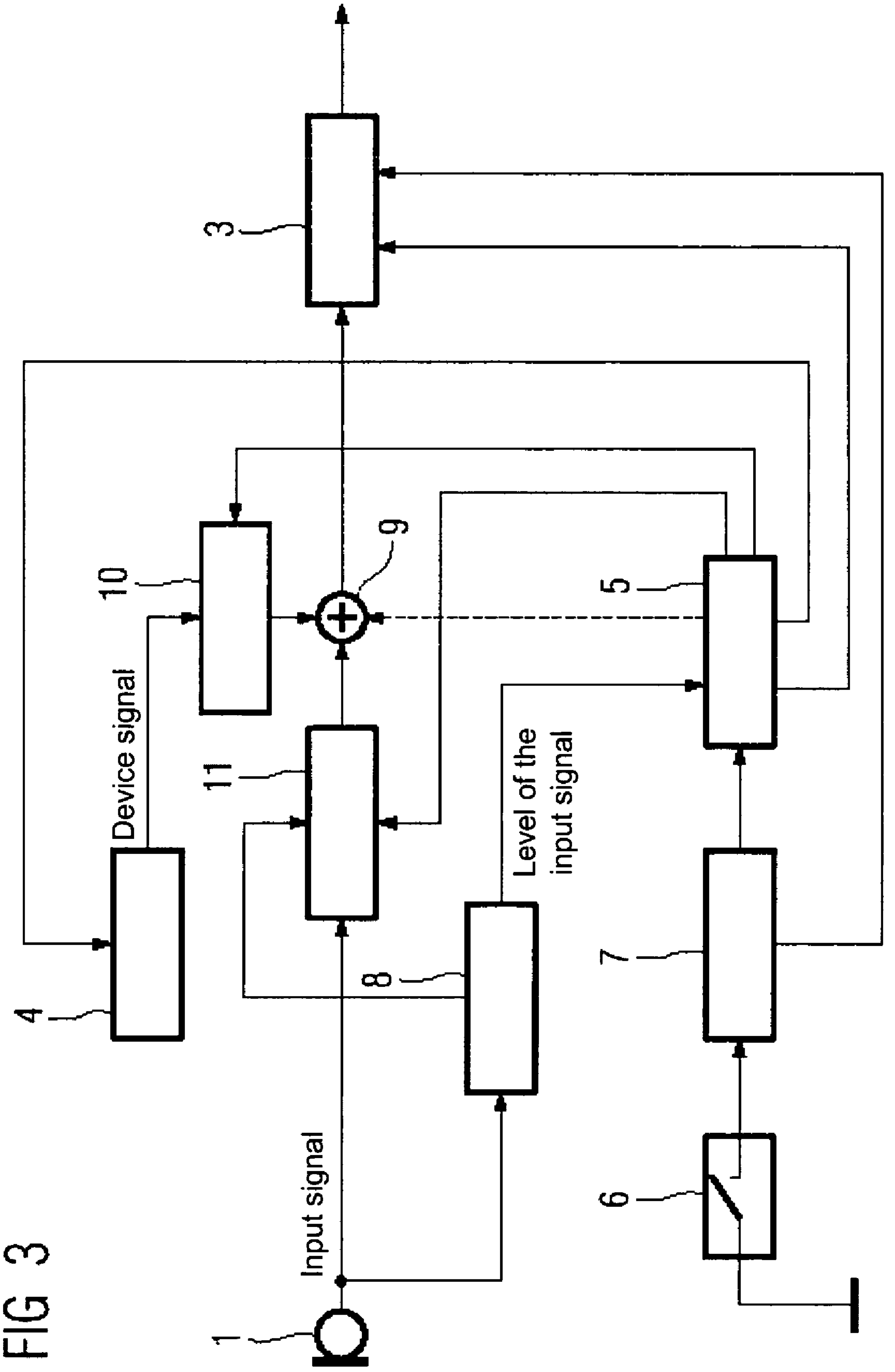
FIG. 3 is a block diagram relating to setting the level of the device signal and the level of the input signal.

The third embodiment, whose block diagram is sketched in FIG. 3, is an even more convenient solution for reliably perceiving a device signal. This solution is based on the second embodiment and is supplemented by a second gain adjuster or, as the case may be, regulator 11 connected between the microphone 1 and the adder 9. It receives the level of the input signal from the level meter 8 as the manipulated variable. It is also driven by the control logic 5 in order, for example, to downwardly adjust the gain in good time before the device signal is fed out. It is thus possible when feeding out the device signal with a required level to adjust the level of the input signal to below that of the device signal and keep it constant.

Figure 4:
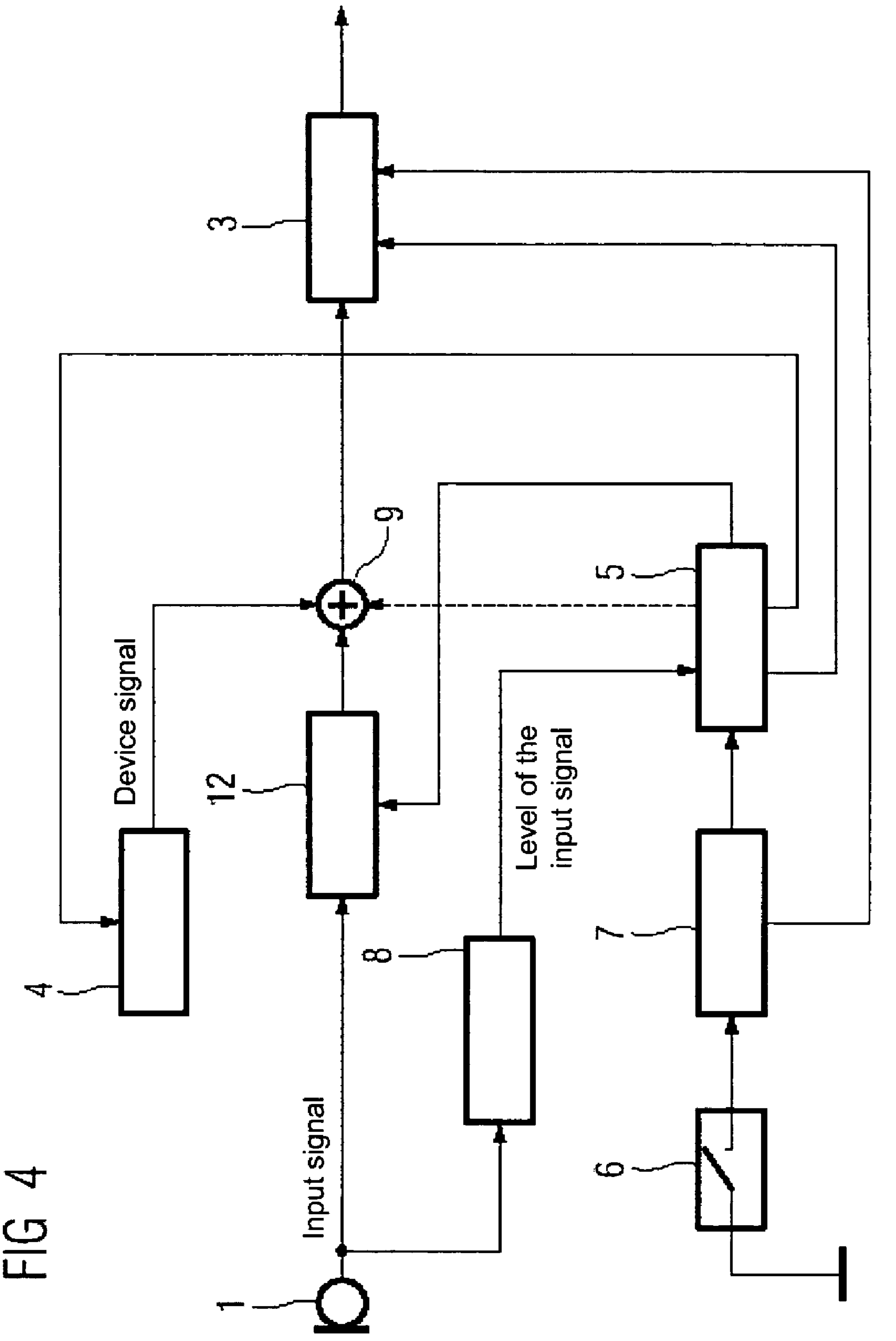
FIG. 4 is a block diagram relating to downward adjustment of the input level when the device signal level is constant.

A fourth embodiment of the present invention is shown in FIG. 4. This embodiment is essentially similar to the first embodiment, except that in this case the input signal is not muted but, instead, is adjusted in terms of its level to below that of the device signal. The input signal will then continue to be audible. In component terms, this embodiment is a simplified third embodiment because it dispenses with the gain adjuster 10 between the generator 4 and the adder 9 and because the gain adjuster/regulator 11 is implemented as a simple gain adjuster 12 receiving no feedback signal from the level meter 8. With the gain adjuster 12, the level of the input signal can in this way be adjusted up or down via the control logic 5.

According to a fifth embodiment of the present invention, a device signal will only be fed out if the input signal falls below a certain level for a predefined period of time. This embodiment is not shown in the figures. It has a pause-search algorithm by means of which a time segment having a low level of ambient noise can be determined. A waiting device signal can then be transmitted in this time segment. This means that transmission of the input signal for conveying the device signal will not be irritatingly interrupted or attenuated. This type of notification for the hearing aid wearer would suffice for less time-critical status information such as that relating to, say, the battery status.

Figure 5:
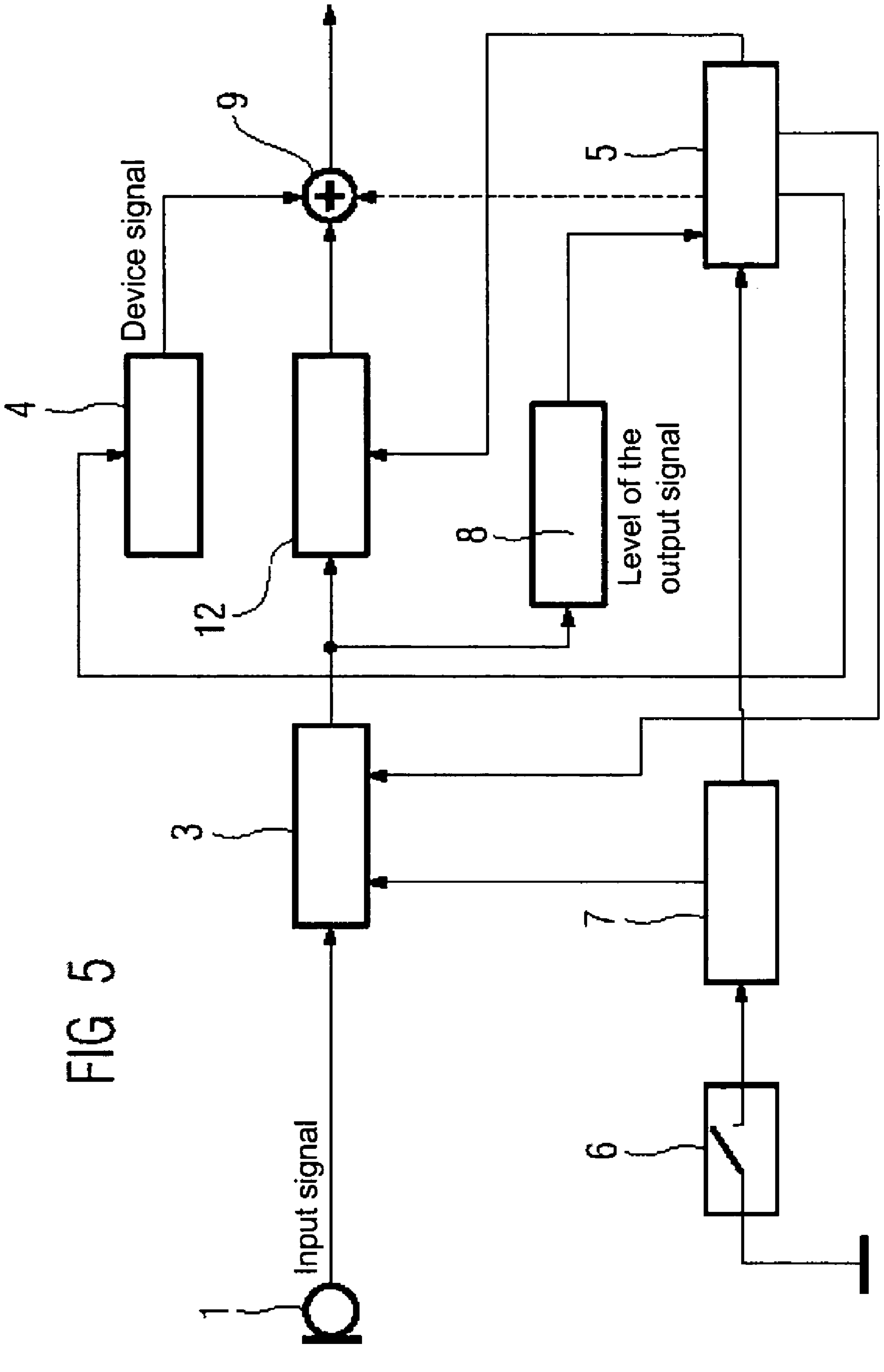
FIG. 5 is a block diagram of a case in which input signal processing takes place ahead of device signal generation.

According to a sixth embodiment of the present invention shown in FIG. 5, the hearing aid signal processing device 3 is connected upstream of the device signal injector. The input signal is accordingly fed directly into the hearing aid signal processing device 3 whose output signal is then forwarded to the device signal injector. According to the variant shown in FIG. 5, where the device signal injector corresponds to that of embodiment 4 (FIG. 4), the output signal of the hearing aid signal processing device 3 is accordingly routed to the gain adjuster 12 and to the level meter 8. Further processing takes place analogously. It is, however, also possible to use, for example, the device signal injectors according to embodiments 1 to 3 instead of the device signal injector shown in FIG. 5.

The components shown in FIGS. 2 to 5 not cited in the associated description are explained in more detail in connection with FIG. 1. Reference is therefore made to the relevant part of the description relating to FIG. 1 for details of how these components are connected and how they operate.

Any practical combinations of the six embodiments presented above are of course also conceivable. Different embodiments can, for example, be implemented simultaneously in the hearing aid and also activated as a function of the input level.

The invention claimed is:

1. A hearing aid, comprising:

a microphone for receiving an input signal;

a level meter coupled to receive the input signal and provide a level signal indicative of the input signal level;

a signal generating unit for generating a device signal based on a hearing aid parameter, the device signal being generated by the hearing aid itself;

a signal processing device capable of providing an output signal based on a combination of the input signal and the device signal; and an adjusting unit having control logic connected to receive the level signal and to adjust the input signal or the device signal, one relative to the other, prior to receipt of the input signal and the device signal by the signal processing device so that the device signal, as a component of the signal processing device output signal, is not obscured relative to the input signal, such that prevailing ambient noise is taken into consideration during automatic or adaptive matching of the device signal or the input signal.

2. The hearing aid according to claim 1, wherein the adjusting unit adjusts both the device signal to the input signal and the input signal to the device signal.

3. The hearing aid according to claim 1, wherein the hearing aid parameter represents an element chosen from the group consisting of a setting parameter value, a status parameter value, change-of-setting information and change-of-status information related to the operational condition of the hearing aid.

4. The hearing aid according to claim 1, wherein the signal generating unit is adapted to generate a signal shape related to the device signal using the hearing aid parameter.

5. The hearing aid according claim 1, wherein an element chosen from the group consisting of a duration of the device signal, a level of the device signal and a signal shape of the device signal is adjusted to the input signal.

6. The hearing aid according to claim 1, wherein a level of the input signal is adjusted to the device signal.

7. The hearing aid according claim 1, wherein the input signal is suppressed while outputting the device signal or the output signal by the output unit.

8. The hearing aid according to claim 1, wherein a temporal behavior of the device signal is adjusted to the input signal.

9. The hearing aid according to claim 8, wherein the device signal is only output by the signal processing device if a level of the input signal is below a limit level.

10. The hearing aid according to claim 1, wherein adjusting the device signal to the input signal or adjusting the input signal to the device signal by the adjusting device is based on a level of the input signal and a signal shape of the input signal or on a classification of the input signal.

11. A method of operating a hearing aid, comprising:

receiving an input signal of a microphone;

determining a level for the input signal and generating a level signal indicative thereof;

generating a device signal having a signal level based on a hearing aid parameter, the device signal being generated by the hearing aid itself;

providing an output signal based on a combination of the input signal and the device signal;

generating a logic output signal for modifying the level of the input signal or modifying the signal level of the device signal; and applying the logic output signal to adjust the device signal relative to the input signal or to adjust the input signal relative to the device signal so that the device signal, as a component of the signal processing device output signal, is not obscured relative to the input signal, such that prevailing ambient noise is taken into consideration during automatic or adaptive matching of the device signal or the input signal.

12. The method according to claim 11, wherein the hearing aid parameter represents an element chosen from the group consisting of a setting parameter value, a status parameter value, change-of-setting information and change-of-status information related to the operational condition of the hearing aid.

13. The method according to claim 11, wherein a shape of the device signal is generated based on the hearing aid parameter.

14. The method according to claim 11, wherein an element chosen from the group consisting of a duration of the device signal, a level of the device signal and a signal shape of the device signal is adjusted to the input signal.

15. The method according to claim 11, wherein a level of the input signal is adjusted to the device signal.

16. The method according to claim 11, wherein the input signal is suppressed while outputting the device signal or the output signal.

17. The method according to claim 11, wherein a temporal behavior of the device signal is adjusted to the input signal.

18. The method according to claim 17, wherein the device signal is only output if a level of the input signal is below a limit level.

19. The method according to claim 11, wherein adjusting the device signal to the input signal or adjusting the input signal to the device signal is based on a level of the input signal and a signal shape of the input signal or on a classification of the input signal.

20. A hearing aid, comprising:

a microphone for receiving an input signal;

a level meter coupled to receive the input signal and provide a level signal indicative of the input signal level;

a signal generating unit for generating a device signal based on a hearing aid parameter, the device signal being generated by the hearing aid itself;

a signal processing device capable of providing an output signal based on a combination of the input signal and the device signal; and an adjusting unit having control logic connected to receive the level signal and to adjust the input signal or the device signal, one relative to the other, prior to receipt of the input signal and the device signal by the signal processing device so that the device signal, as a component of the signal processing device output signal, is not obscured relative to the input signal;

wherein a temporal behavior of the device signal is adjusted to the input signal, and wherein the device signal is only output by the signal processing device if a level of the input signal is below a limit level.

* * * * *